(12) United States Patent
Shim et al.

(10) Patent No.: US 12,073,865 B2
(45) Date of Patent: Aug. 27, 2024

(54) USER SYSTEM INCLUDING FIRST AND SECOND DEVICES SHARING SHARED VOLTAGE AND POWER MANAGEMENT INTEGRATED CIRCUIT GENERATING SHARED VOLTAGE, AND OPERATION METHOD THEREOF

(71) Applicant: Samsung Electronics Co., Ltd., Suwon-si (KR)

(72) Inventors: Hyunsoo Shim, Uijeongbu-si (KR); Byoungsul Kim, Suwon-si (KR); Joonmin Park, Seoul (KR); Sungtack Hong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 17/851,794

(22) Filed: Jun. 28, 2022

(65) Prior Publication Data

US 2023/0009061 A1    Jan. 12, 2023

(30) Foreign Application Priority Data

Jul. 8, 2021 (KR) .................. 10-2021-0089873

(51) Int. Cl.
*G06F 1/26* (2006.01)
*G06F 1/3225* (2019.01)
(Continued)

(52) U.S. Cl.
CPC .......... *G11C 11/406* (2013.01); *G06F 1/3225* (2013.01); *G11C 11/4096* (2013.01); *G06F 1/3203* (2013.01); *H02M 1/44* (2013.01)

(58) Field of Classification Search
CPC .............. G11C 11/406; G11C 11/4096; G11C 5/147; G11C 5/148; G11C 2211/4067;
(Continued)

(56) References Cited

U.S. PATENT DOCUMENTS

| 8,607,036 | B2 | 12/2013 | More et al. |
| 8,797,110 | B2 | 8/2014 | Fan et al. |
| 8,810,209 | B2 | 8/2014 | Zhu et al. |
| 10,126,791 | B2 | 11/2018 | Beeston et al. |
| 10,761,588 | B2 | 9/2020 | Rowley et al. |
| 10,861,567 | B2 * | 12/2020 | Rowley .................... G06F 1/28 |

(Continued)

FOREIGN PATENT DOCUMENTS

KR            100912067 B1      8/2009

*Primary Examiner* — Volvick Derose
(74) *Attorney, Agent, or Firm* — Harness, Dickey & Pierce, P.L.C.

(57) ABSTRACT

Disclosed is a user system which includes a first device and a second device, which share a shared voltage, and a power management integrated circuit (PMIC) generating the shared voltage. An operation method of the user system includes performing a first operation of the first device, determining whether a second operation of the second device is to be performed while the first device performs the first operation, based on an operation profile, and when it is determined that the second operation of the second device is to be performed while the first device performs the first operation, changing a power mode of the PMIC from a first power mode to a second power mode, before the second device performs the second operation. The PMIC generates the shared voltage based on the first power mode or the second power mode.

20 Claims, 19 Drawing Sheets

(51) Int. Cl.
  *G11C 11/406* (2006.01)
  *G11C 11/4096* (2006.01)
  *G06F 1/3203* (2019.01)
  *H02M 1/44* (2007.01)

(58) Field of Classification Search
  CPC .............. G11C 11/005; G11C 11/4074; G11C 16/30; G06F 1/3225; G06F 3/0625; G06F 3/0634; G06F 3/0679; G06F 1/30; G06F 1/26; G06F 1/28; H02M 1/44; H02M 1/0035; H02M 1/0032; Y02D 10/00
  USPC ......................................................... 713/300
  See application file for complete search history.

(56) References Cited

U.S. PATENT DOCUMENTS

| | | | | |
|---|---|---|---|---|
| 11,221,667 | B1* | 1/2022 | Ravipati | G06F 1/3296 |
| 2006/0026447 | A1* | 2/2006 | Naveh | G06F 1/324 |
| | | | | 713/322 |
| 2011/0057914 | A1* | 3/2011 | Nam | G09G 3/3648 |
| | | | | 345/211 |
| 2014/0028411 | A1* | 1/2014 | Fan | H03L 3/00 |
| | | | | 331/173 |
| 2015/0160674 | A1* | 6/2015 | Burdette | G06F 13/385 |
| | | | | 700/295 |
| 2016/0124478 | A1* | 5/2016 | Beeston | G06F 1/26 |
| | | | | 713/300 |
| 2016/0357245 | A1* | 12/2016 | Heo | G06F 1/26 |
| 2019/0278363 | A1* | 9/2019 | Rowley | G06F 1/3287 |
| 2019/0346908 | A1* | 11/2019 | Srinivas | G06F 1/26 |
| 2020/0050252 | A1* | 2/2020 | Rowley | G06F 3/0634 |
| 2023/0401310 | A1* | 12/2023 | Davis | G01R 21/133 |

\* cited by examiner

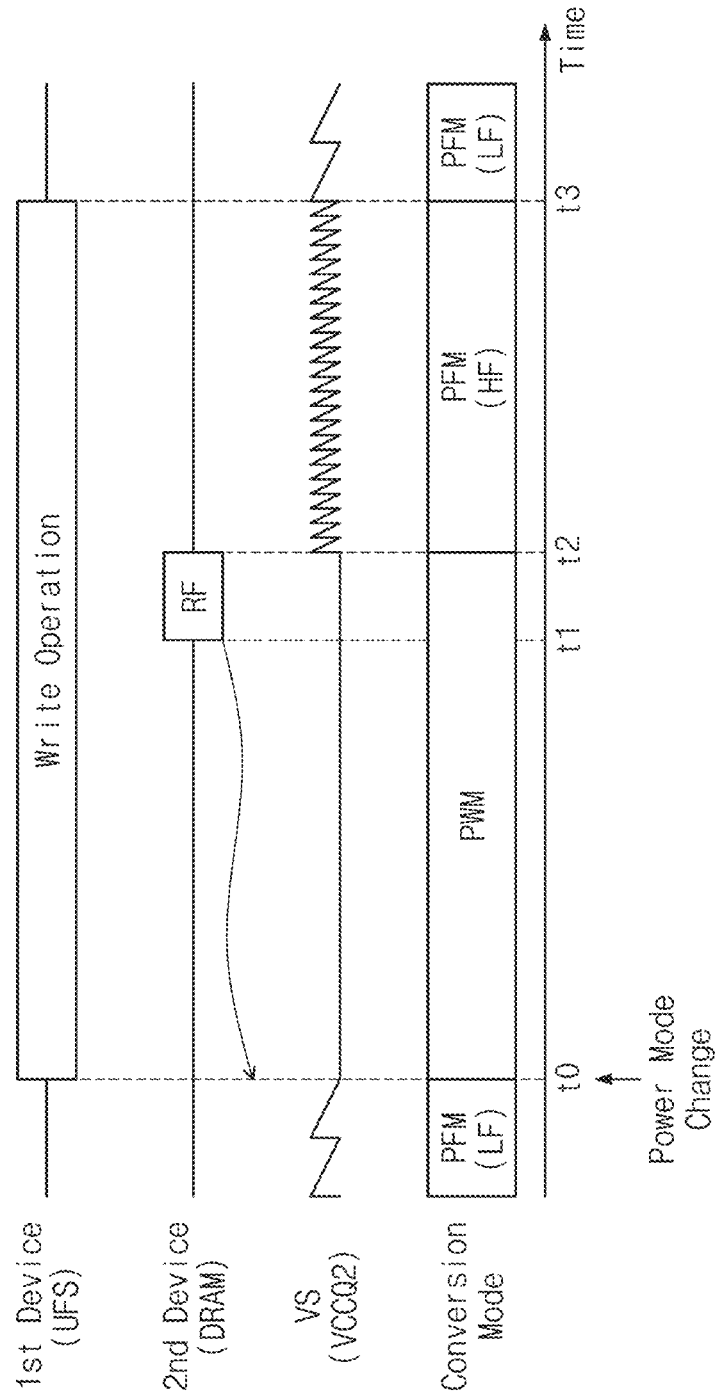

| 1st Device | Exe. Time | |
|---|---|---|
| Operation | T_exe | T_st |
| OP11 | T_exe11 | T_st11 |
| OP12 | T_exe12 | T_st12 |
| ⋮ | ⋮ | ⋮ |
| OP1n | T_exe1n | T_st1n |

| 2nd Device | Exe. Time | |
|---|---|---|
| Operation | T_exe | T_st |
| OP21 | T_exe21 | T_st21 |
| OP22 | T_exe22 | T_st22 |
| ⋮ | ⋮ | ⋮ |
| OP2m | T_exe2m | T_st2m |

USER SYSTEM INCLUDING FIRST AND SECOND DEVICES SHARING SHARED VOLTAGE AND POWER MANAGEMENT INTEGRATED CIRCUIT GENERATING SHARED VOLTAGE, AND OPERATION METHOD THEREOF

CROSS-REFERENCE TO RELATED APPLICATIONS

This application claims priority under 35 U.S.C. § 119 to Korean Patent Application No. 10-2021-0089873 filed on Jul. 8, 2021, in the Korean Intellectual Property Office, the disclosures of which are incorporated by reference herein in their entireties.

BACKGROUND

Example embodiments of the present disclosure described herein relate to an electronic device, and more particularly, relate to a user system including first and second devices sharing a shared voltage and a power management integrated circuit configured to generate the shared voltage, and an operation method thereof.

Electronic devices such as a smartphone and a tablet personal computer (PC) include various components to provide various functions to a user. Various components included in an electronic device operate based on various voltages or powers provided from a power management integrated circuit. A voltage or power that is provided from the power management integrated circuit may become unstable depending on an operating situation of the electronic device, thereby causing the reduction of stability and/or reliability of the electronic device.

SUMMARY

Embodiments of the present disclosure provide a user system including first and second devices sharing a shared voltage with improved power stability and reliability and/or a power management integrated circuit configured to generate the shared voltage, and an operation method thereof.

According to example embodiments, a user system includes a first device and a second device, which share a shared voltage, and a power management integrated circuit (PMIC) generating the shared voltage. An operation method of the user system includes performing a first operation of the first device, determining whether a second operation of the second device is to be performed while the first device performs the first operation, based on an operation profile, and when it is determined that the second operation of the second device is to be performed while the first device performs the first operation, changing a power mode of the PMIC from a first power mode to a second power mode, before the second device performs the second operation. The PMIC generates the shared voltage based on the first power mode or the second power mode.

According to example embodiments, a user system includes a power management integrated circuit (PMIC) that generates a shared voltage, based on one of a first power mode and a second power mode, a first device that operates by using the shared voltage, a second device that operates by using the shared voltage, and a host device that controls the first device and the second device, determines an overlapping period in which the first device and the second device perform operations at the same time, and changes a power mode of the PMIC from the first power mode to the second power mode before the overlapping period.

According to example embodiments, a user system includes a universal flash storage (UFS) device and a dynamic random access memory (DRAM) device, which share a first voltage, and a power management integrated circuit (PMIC) generating the first voltage. An operation method of the user system includes performing a write operation on the UFS device, and when a refresh operation of the DRAM device is to be performed while the write operation is performed, changing a power mode of the PMIC from a first power mode to a second power mode, before the refresh operation is performed.

BRIEF DESCRIPTION OF THE FIGURES

The above and other objects and features of the present disclosure will become apparent by describing in detail example embodiments thereof with reference to the accompanying drawings.

FIGS. 6A to 6F are timing diagrams for describing an operation of a user system according to the flowchart of FIG. 4.

FIG. 7 is a diagram illustrating example embodiments of an operation profile included in a host device of FIG. 1.

DETAILED DESCRIPTION

Below, example embodiments of the present disclosure may be described in detail and clearly to such an extent that an ordinary one in the art easily implements the inventive concepts.

Figure 1:
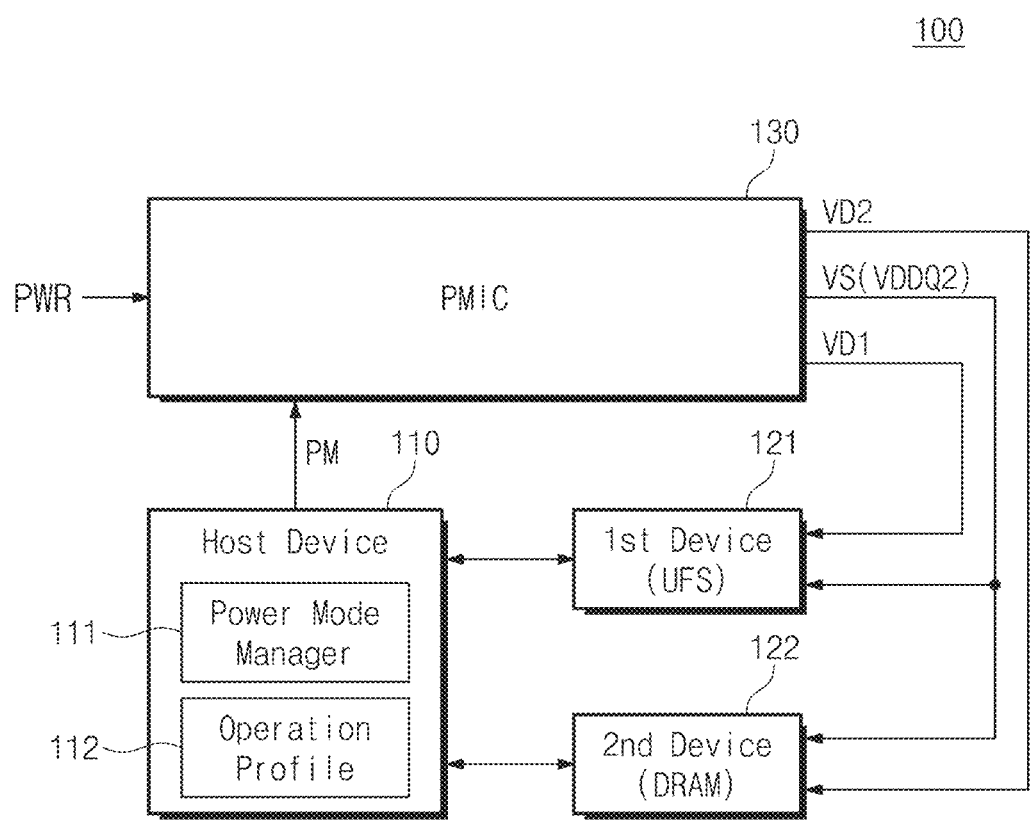
FIG. 1 is a block diagram illustrating a user system according to example embodiments of the present disclosure.

FIG. 1 is a block diagram illustrating a user system according to example embodiments of the present disclosure. Referring to FIG. 1, a user system 100 may include a host device 110, a first device 121, a second device 122, and/or a power management integrated circuit (PMIC) 130. In example embodiments, the user system 100 may be a computing system, which is configured to provide various functions to the user, such as a computer, a portable computer, a ultra-mobile personal computer (UMPC), a workstation, a server computer, a net-book, a portable communication terminal, a personal digital assistant (PDA), a portable media player (PMP), a portable computer, a web tablet, a wireless phone, a mobile phone, a smartphone, a digital camera, a digital audio recorder, a digital audio player, a digital picture recorder, a digital picture player, a digital video recorder, a digital video player, a wearable device, a monitor, a television (TV), and a smart TV.

The host device 110 may control overall operations of the user system 100. For example, the host device 110 may include a central processing unit (CPU) or an application processor (AP) included in the user system 100. The host device 110 may be configured to control the first device 121 and the second device 122.

For example, each of the first and second devices 121 and 122 may operate under control of the host device 110. In example embodiments, the first device 121 may include a storage device (e.g., universal flash storage (UFS)) configured to store data that are used in the user system 100. The second device 122 may include a memory device (e.g., a dynamic random access memory (DRAM)) that is used as a buffer memory, a working memory, or a system memory of the user system 100. However, the present disclosure is not limited thereto. For example, each of the first and second devices 121 and 122 may include at least a part of various devices or components included in the user system 100.

The PMIC 130 may generate various operating voltages VD1, VD2, and VS based on an input power PWR and may provide the first and second devices 121 and 122 with the operating voltages VD1, VD2, and VS thus generated. In example embodiments, the input power PWR may be provided from a battery included in the user system 100 or may be provided from a separate power supply device.

In example embodiments, each of the first and second devices 121 and 122 may operate by using various operating voltages, under control of the host device 110. For example, the first device 121 may receive the first operating voltage VD1 and the shared voltage VS from the PMIC 130 and may operate by using the received voltages VD1 and VS. The second device 122 may receive the second operating voltage VD2 and the shared voltage VS from the PMIC 130 and may operate by using the received voltages VD2 and VS. As described above, the first and second devices 121 and 122 may be configured to share some (e.g., the shared voltage VS) of various operating voltages generated from the PMIC 130. In example embodiments, when the first device 121 is a UFS device and the second device 122 is a DRAM device, the shared voltage VS may be a VDDQ2 voltage of 1.8 V.

In example embodiments, the host device 110 may include a power mode manager 111 and/or an operation profile 112. The power mode manager 111 may be configured to control a power mode of the PMIC 130 by using a power mode signal PM. For example, the PMIC 130 may operate based on various power modes. The power modes may be selected based on states or levels of the operating voltages VD1, VD2, and VS or may be selected under control of the host device 110.

The power mode manager 111 may predict operation states of the first and second devices 121 and 122 based on the operation profile 112 and may control a power mode of the PMIC 130 based on a prediction result. For example, based on the operation profile 112, the power mode manager 111 may predict whether an operation of the second device 122 is performed while the first device 121 operates or whether the first and second devices 121 and 122 operate at the same time. The power mode manager 111 may change a power mode of the PMIC 130 in advance based on a prediction result.

In example embodiments, to change the power mode of the PMIC 130 in advance may mean to change a power mode in advance before the first and second devices 121 and 122 operate at the same time. A sharp level change (or a voltage drop) of the shared voltage VS due to the simultaneous operation of the first and second devices 121 and 122 may be reduced or prevented by changing a power mode of the PMIC 130 in advance. Accordingly, the reliability of the user system 100 may be improved. A power mode changing method of the present disclosure will be described in more detail with reference to the following drawings.

In example embodiments, the host device 110 may control the PMIC 130 through an interface, such as a system power management interface (SPMI), or a system bus. For example, the host device 110 may control or change a power mode of the PMIC 130 through the SPMI.

Figure 2:
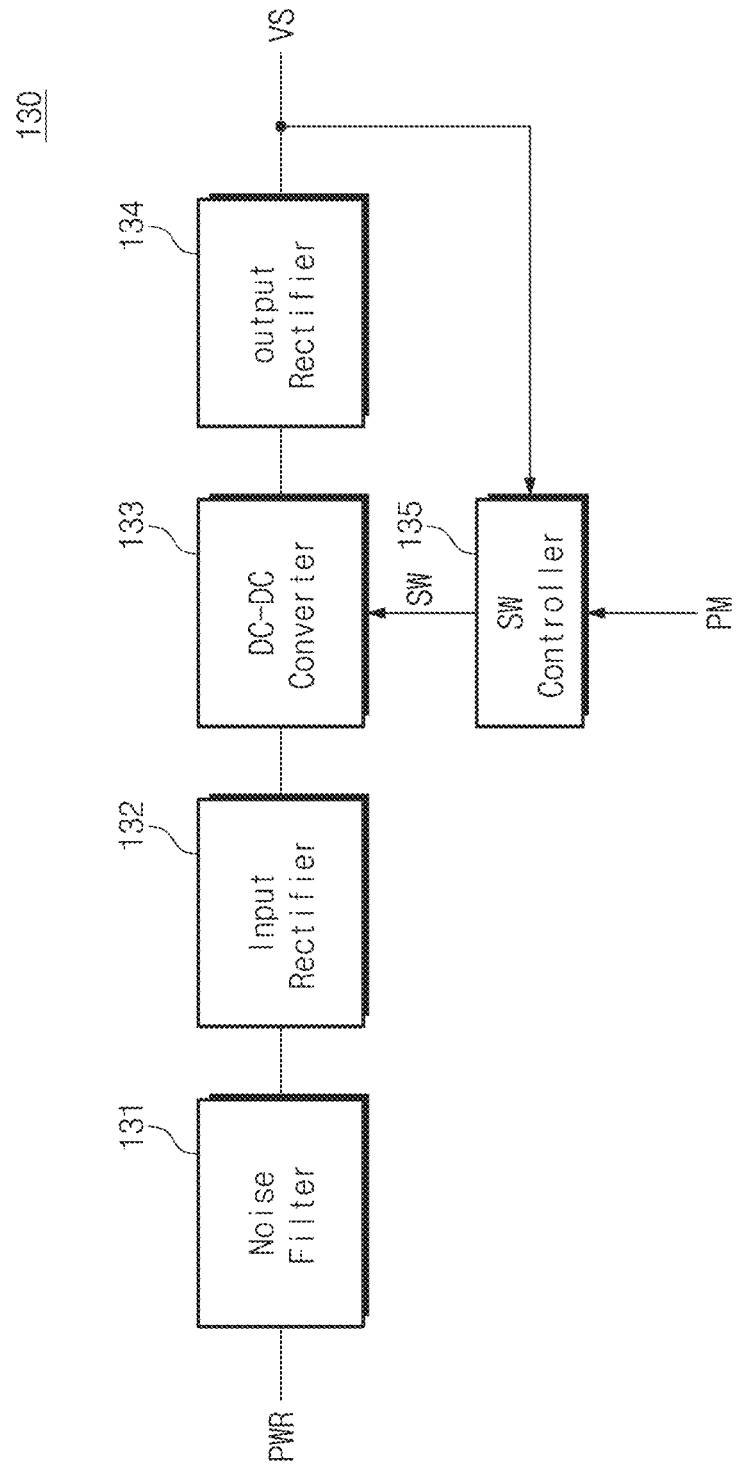
FIG. 2 is a block diagram illustrating a PMIC of FIG. 1.

FIG. 2 is a block diagram illustrating a PMIC of FIG. 1. For brevity of drawing and convenience of description, some components (e.g., components necessary to generate the shared voltage VS) of the PMIC 130 are illustrated in FIG. 2, but the present disclosure is not limited thereto. The PMIC 130 may further include additional components for generating various other operating voltages including the operating voltages VD1 and VD2.

Referring to FIGS. 1 to 2, the PMIC 130 may include a noise filter 131, an input rectifier 132, a DC-DC converter 133, an output rectifier 134, and/or a switch controller 135.

The noise filter 131 may be configured to receive the input power PWR and to remove various noises of the input power PWR. The input rectifier 132 may be configured to rectify a power output from the noise filter 131. The DC-DC converter 133 may be configured to perform a switching operation based on a switching signal SW from the switch controller 135 and to control a level of the power output from the input rectifier 132. In example embodiments, the DC-DC converter 133 may be an isolated converter or a non-isolated converter. The output rectifier 134 may rectify an output of the DC-DC converter 133 to output the shared voltage VS.

The switch controller 135 may generate the switching signal SW based on the shared voltage VS output from the output rectifier 134. In example embodiments, the switch controller 135 may generate the switching signal SW such that the shared voltage VS reaches a target voltage or maintains the target voltage.

In example embodiments, the switch controller 135 may generate the switching signal SW in response to the power mode signal PM from the host device 110. For example, the switch controller 135 may modulate the switching signal SW based on various power modes (e.g., pulse frequency modulation (PFM) or pulse width modulation (PWM)). The PFM scheme may be efficient in a light load, and the PWM scheme may be efficient in a heavy load. The PFM scheme and the PWM scheme will be described in more detail with reference to FIG. 3.

Figure 3:
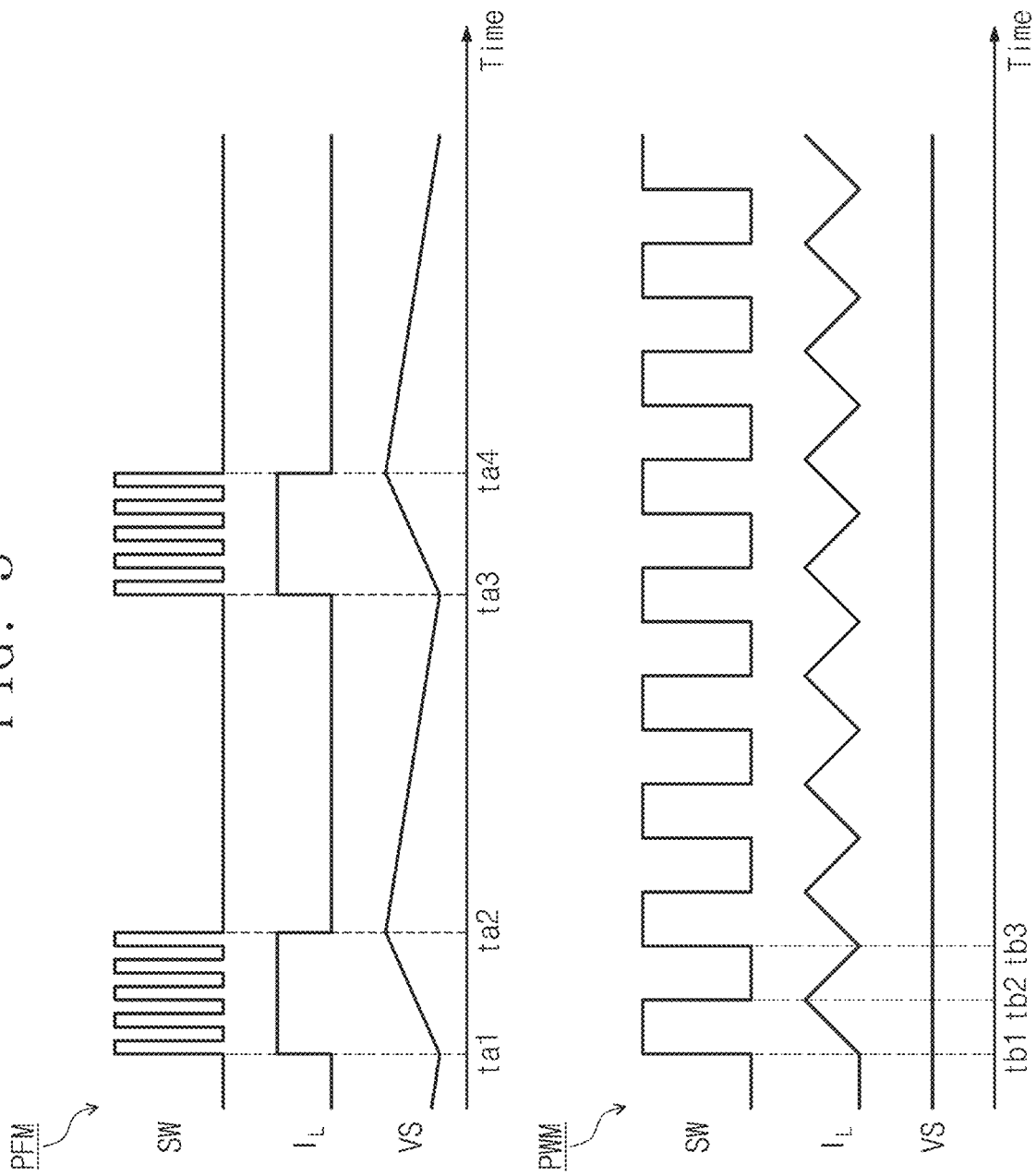
FIG. 3 illustrates timing diagrams for describing power modes of a PMIC of FIG. 2.

FIG. 3 illustrates timing diagrams for describing power modes of a PMIC of FIG. 2. Referring to FIGS. 1 to 3, the PMIC 130 may generate the shared voltage VS based on a PFM mode or a PWM mode. The PFM mode refers to a mode of modulating a frequency of the switching signal SW while maintaining a high-level period (e.g., a pulse width) of the switching signal SW. For example, as illustrated in FIG. 3, in the PFM mode, the switching signal SW may toggle during a time period from ta1 to ta2 (e.g., an operation may be performed at a high frequency). In some example embodiments, as a load current $I_L$ increases, the shared voltage VS may increase. During a time period from ta2 to ta3, the switching signal SW may maintain a low level (e.g., an operation may be performed at a low frequency). In some example embodiments, as the load current $I_L$ is not provided, the shared voltage VS may decrease. Afterwards, the switching signal SW may toggle during a time period from ta3 to ta4. In some example embodiments, waveforms of the load current $I_L$ and the shared voltage VS may be similar to those described above, and thus, additional description will be omitted to avoid redundancy.

As described above, in the PFM mode, when the shared voltage VS reaches a reference value, a level of the shared voltage VS may increase by generating the switching signal SW of a high frequency. The PFM mode may be appropriate for example embodiments where a load corresponding to the shared voltage VS is in a light load state.

The PWM mode refers to a mode of modulating a high-level pulse width of the switching signal SW while maintaining a frequency of the switching signal SW. For example, as illustrated in FIG. 3, in the PWM mode, the switching signal SW may have a high level during a time period from tb1 to tb2. In some example embodiments, the load current $I_L$ may increase. Afterwards, during a time period from tb2 to tb3, the switching signal SW may maintain a low level. In some example embodiments, the load current $I_L$ may decrease. The load current $I_L$ may increase or decrease depending on the level of the switching signal SW, and thus, the level of the shared voltage VS may be maintained substantially uniformly.

In example embodiments, when the level of the shared voltage VS is relatively low, a length of the high-level period of the switching signal SW may increase; when the level of the shared voltage VS is relatively high, the length of the high-level period of the switching signal SW may decrease. The PWM mode may be appropriate for example embodiments where a load corresponding to the shared voltage VS is in a heavy load state.

In example embodiments, when one of the first and second devices 121 and 122 operates, the PMIC 130 may stably provide the shared voltage VS to one of the first and second devices 121 and 122 based on the PFM mode. However, when the first and second devices 121 and 122 operate at the same time, the PMIC 130 may fail to stably provide the shared voltage VS based on the PFM mode. In some example embodiments, the PMIC 130 may stably provide the shared voltage VS based on the PWM mode.

The pulse frequency modulation (PFM) mode and the pulse width modulation (PWM) mode described above are some example embodiments of the present disclosure, and the present disclosure is not limited thereto. For example, the PMIC 130 may generate the shared voltage VS based on various power modes.

Figure 4:
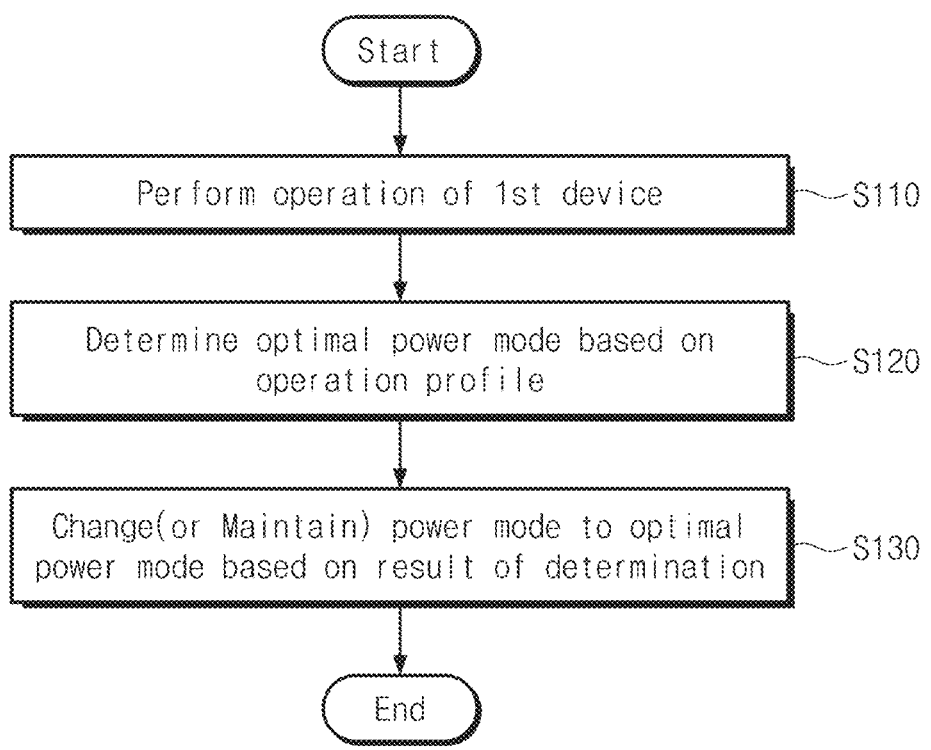
FIG. 4 is a flowchart illustrating an operation of a host device of FIG. 1.

FIG. 4 is a flowchart illustrating an operation of a host device of FIG. 1. Referring to FIGS. 1 and 4, in operation S110, the host device 110 may perform an operation of the first device 121. For example, the host device 110 may store data in the first device 121 or may read data stored in the first device 121. The first device 121 may operate under control of the host device 110, by using various voltages (e.g., VD1 and VS) provided from the PMIC 130.

In operation S120, the host device 110 may determine an optimal power mode, based on the operation profile 112. For example, based on the operation profile 112, the host device 110 may predict whether an operation of the second device 122 is to be performed while performing the operation of the first device 121. Alternatively, based on the operation profile 112, the host device 110 may predict or determine whether a period in which the first device 121 and the second device 122 operate at the same time occurs. The host device 110 may determine an optimal power mode, based on a result of the determination.

In operation S130, based on a result of the determination, the host device 110 may change a power mode to the optimal power mode or may maintain the power mode. For example, when the host device 110 starts to perform the operation of the first device 121, the host device 110 may not perform an operation of the second device 122. In some example embodiments, the PMIC 130 may operate based on the PFM mode appropriate for the light load.

When the determination result indicates that the operation of the second device 122 is not performed or that the first and second devices 121 and 122 do not operate at the same time, the host device 110 may maintain the PFM mode appropriate for a light load, without changing the power mode. In contrast, when the determination result indicates that the operation of the second device 122 is predicted or expected or that the simultaneous operation of the first and second devices 121 and 122 is predicted, the host device 110 may change the power mode of the PMIC 130 to an optimal power mode (e.g., the PWM mode appropriate for the heavy load).

In example embodiments, the power mode may be changed before a period in which the first and second devices 121 and 122 operate at the same time. Alternatively, the power mode may be changed before the operation of the second device 122 initiates or starts or before a command corresponding to the operation of the second device 122 is issued or generated.

As described above, the host device 110 according to the present disclosure may predict a period in which the first and second devices 121 and 122 sharing the shared voltage VS operate at the same time, based on the operation profile 112. The host device 110 may change the power mode of the PMIC 130 before the first and second devices 121 and 122 operate at the same time (e.g., in advance), based on a prediction result. As such, because it is possible to cope in advance with a high peak current capable of occurring in a period in which the first and second devices 121 and 122 operate at the same time (e.g., in a heavy load period), the overall reliability of the user system 100 may be improved. In example embodiments, the host device 110 according to the present disclosure may predict a period in which the first and second devices 121 and 122 sharing the shared voltage VS operate at the same time, using a machine learning, an artificial intelligence, or some other technique.

Figure 5:
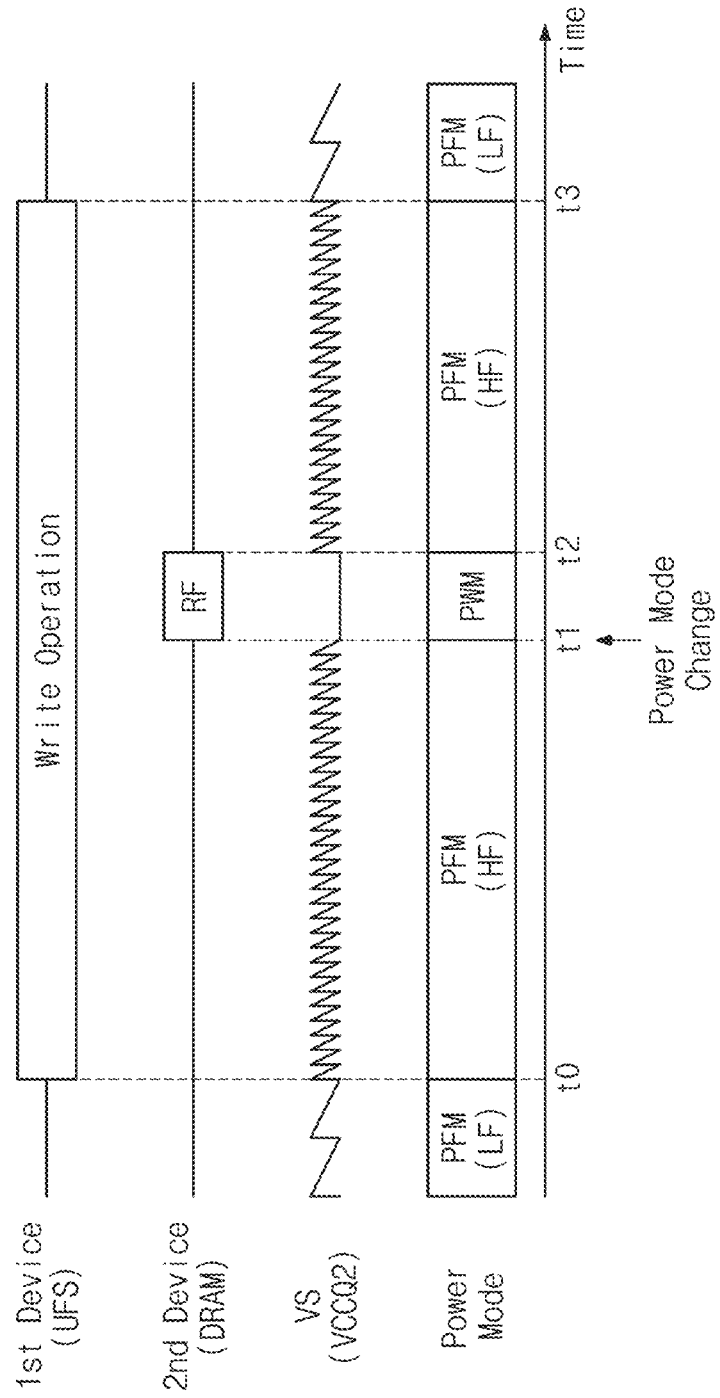
FIG. 5 is a timing diagram illustrating an operation of a user system of FIG. 1.

FIG. 5 is a timing diagram illustrating an operation of a user system of FIG. 1. Below, to describe example embodiments and the technical idea of the present disclosure easily, it is assumed that the first device 121 is a universal flash storage (UFS) device and the second device 122 is a dynamic random access memory (DRAM) device. However, the present disclosure is not limited thereto. For example, the first and second devices 121 and 122 may include various components configured to share the same voltage or the same power (e.g., the shared voltage VS).

Referring to FIGS. 1 and 5, the first device 121 may perform a write operation during a period from t0 to t3, under control of the host device 110. While the first device 121 performs the write operation, the second device 122 may perform a refresh operation (RF) during a period from t1 to t2. That is, during the period from t1 to t2, the first and second devices 121 and 122 may perform the operations at the same time.

In example embodiments, before t0, because the first and second devices 121 and 122 do not perform operations, the shared voltage VS may be in a light load or no load state. Accordingly, the power mode of the PMIC 130 may generate the shared voltage VS based on the PFM mode (in particular, a low-frequency (LF) mode).

At t0, the first device 121 may start the write operation under control of the host device 110. In some example embodiments, because the shared voltage VS is used by the first device 121, the shared voltage VS may drop, or a current corresponding to the shared voltage VS may increase. As such, the PMIC 130 may generate the shared voltage VS based on the PFM mode (in particular, a high-frequency (HF) mode) such that a voltage or current necessary for the write operation of the first device 121 is provided.

Afterwards, at t1, the second device 122 may perform the refresh operation RF. In some example embodiments, because the first and second devices 121 and 122 perform operations at the same time, a peak current corresponding to the shared voltage VS may increase. This may mean that the shared voltage VS decreases. In response to the voltage drop of the shared voltage VS or the increase in the peak current, the PMIC 130 may change a power mode for generating the shared voltage VS from the power mode (e.g., the PFM mode) corresponding to the light load to the power mode (e.g., the PWM mode) corresponding to the heavy load. As such, during the period from t1 to t2, in which the first and second devices 121 and 122 operate at the same time, the level of the shared voltage VS may be stabilized, or a necessary current may be normally provided.

At point in time t2 at which the refresh operation RF of the second device 122 is completed, the PMIC 130 may change the power mode to the power mode (e.g., the PFM mode) corresponding to the light load; at point in time t3 at which the write operation of the first device 121 is completed, the PMIC 130 may change an operating frequency of the PFM mode from the high frequency (HF) to the low frequency (LF).

As described above, the PMIC 130 may change the power mode, based on the level of the shared voltage VS or a magnitude of a current corresponding to the shared voltage VS. In some example embodiments, at a point in time (e.g., t1) at which a peak value of the current corresponding to the shared voltage VS is sharply changed, as the power mode is changed, the level of the shared voltage VS may be unstable. Accordingly, there may be required a technique or device for stabilizing the level of the shared voltage VS, in a sharp load change.

FIGS. 6A to 6F are timing diagrams for describing an operation of a user system according to the flowchart of FIG. 4. For convenience of description, below, it is assumed that the first device 121 is a UFS device, the second device 122 is a DRAM device, and the shared voltage VS shared by the first and second devices 121 and 122 is VDDQ2 of 1.8 V. Also, below, it is assumed that a power mode of the PMIC 130 corresponding to a light load is the PFM mode and a power mode of the PMIC 130 corresponding to a heavy load is the PWM mode. However, the present disclosure is not limited thereto.

Referring to FIGS. 1 and 6A to 6F, under control of the host device 110, the first device 121 may perform a write operation during a period from t0 to t3. Under control of the host device 110, the second device 122 may perform a refresh operation RF during a period from t1 to t2.

In example embodiments, the host device 110 may in advance predict a period in which the first and second devices 121 and 122 operate at the same time, and may change a power mode of the PMIC 130 before the operation of the second device 122 (e.g., in advance), based on a prediction result.

Figure 6A:
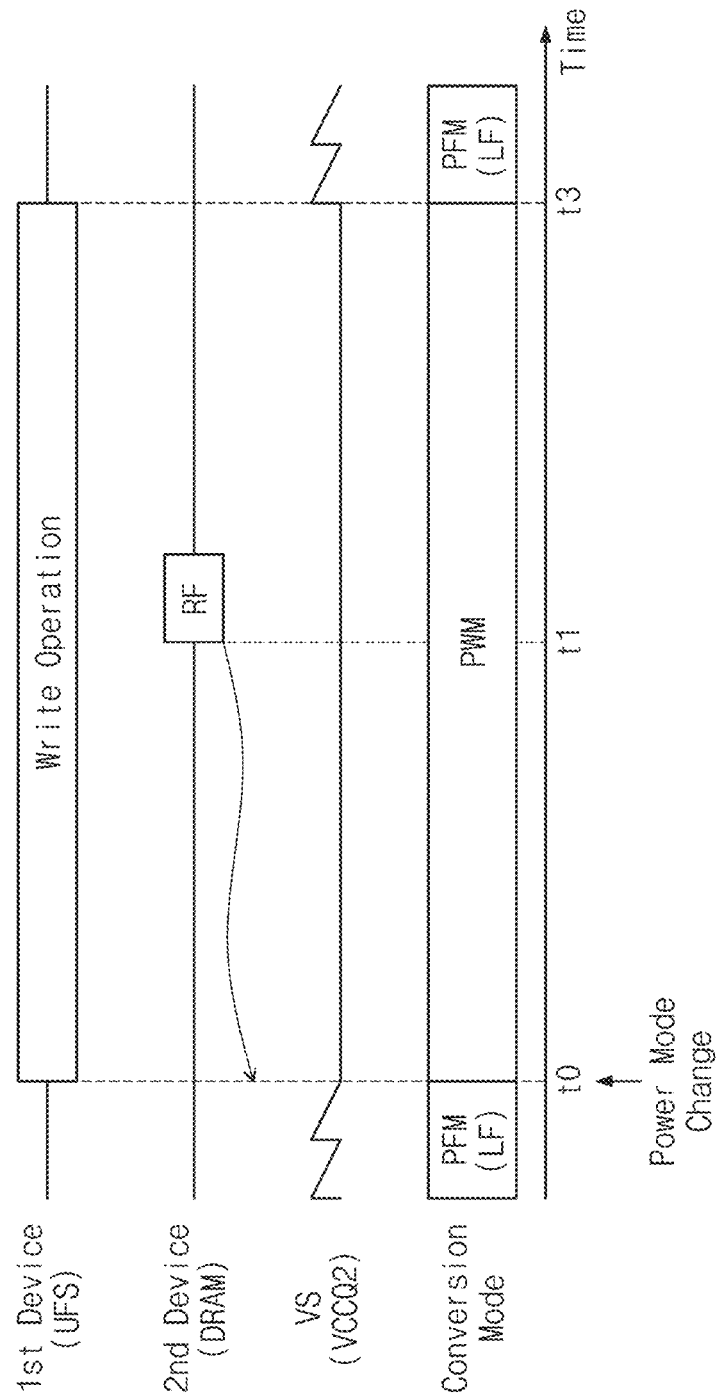

For example, as illustrated in FIG. 6A, the host device 110 may initiate or start the write operation of the first device 121 at point in time t0. In some example embodiments, the power mode manager 111 of the host device 110 may check an expected execution time of the write operation of the first device 121 and an expected start time of the refresh operation of the second device 122, based on the operation profile 112 and may determine a period, in which the first and second devices 121 and 122 operate at the same time, based on a check result.

Before the refresh operation RF of the second device 122 is performed, that is, at point in time t0, the power mode manager 111 may change the power mode of the PMIC 130 from the PFM mode to the PWM mode. In other words, the power mode manager 111 may in advance change the power mode of the PMIC 130 at point in time t0 earlier than point in time t1 being a point in time at which the first and second devices 121 and 122 start to operate at the same time. In example embodiments, the point in time t0 may be a point in time at which the first device 121 initiates or starts the operation.

At point in time t3 at which the write operation of the first device 121 is completed, the power mode manager 111 may change the power mode of the PMIC 130 from the PWM mode to the PFM mode.

Alternatively, as illustrated in FIG. 6B, at point in time t0 at which the write operation of the first device 121 starts, the power mode manager 111 may change the power mode of the PMIC 130 from the PFM mode to the PWM mode. At point in time t2 at which the refresh operation RF of the second device 122 is completed, the power mode manager 111 may change the power mode of the PMIC 130 from the PWM mode to the PFM mode.

Figure 6C:
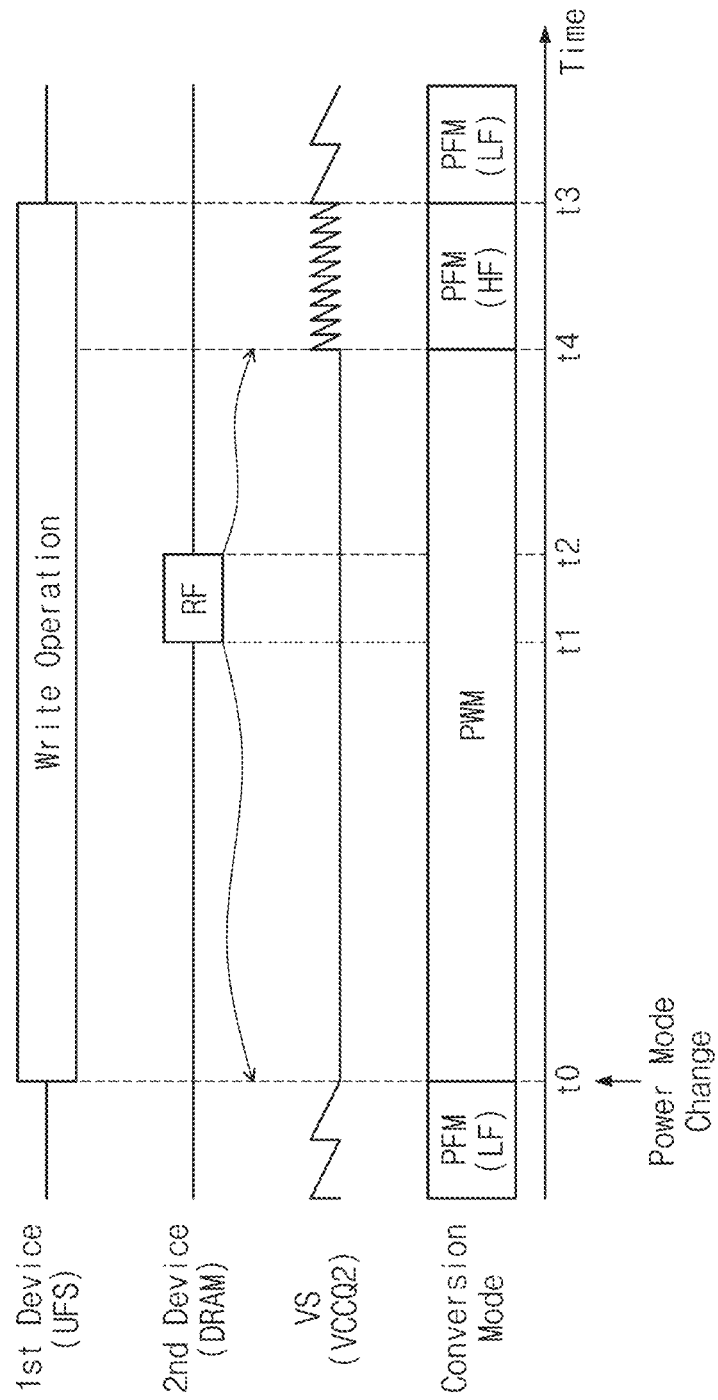

Alternatively, as illustrated in FIG. 6C, at point in time t0 at which the write operation of the first device 121 starts, the power mode manager 111 may change the power mode of the PMIC 130 from the PFM mode to the PWM mode. At point in time t4 at which a reference time or a given time passes from point in time t2 at which the refresh operation RF of the second device 122 is completed, the power mode manager 111 may change the power mode of the PMIC 130 from the PWM mode to the PFM mode.

That is, as described with reference to FIGS. 6B and 6C, the power mode of the PMIC 130 may be changed from the PWM mode to the PFM mode in a period from a point in time at which the refresh operation RF of the second device 122 is completed (e.g., from point in time t2) to a point in time at which the write operation of the first device 121 is completed (e.g., to point in time t3). The reason is that because only the write operation of the first device 121 is performed during a period from t2 to t3, the shared voltage VS is stably provided in the PFM mode of the PMIC 130 during the write operation of the first device 121.

Figure 6D:
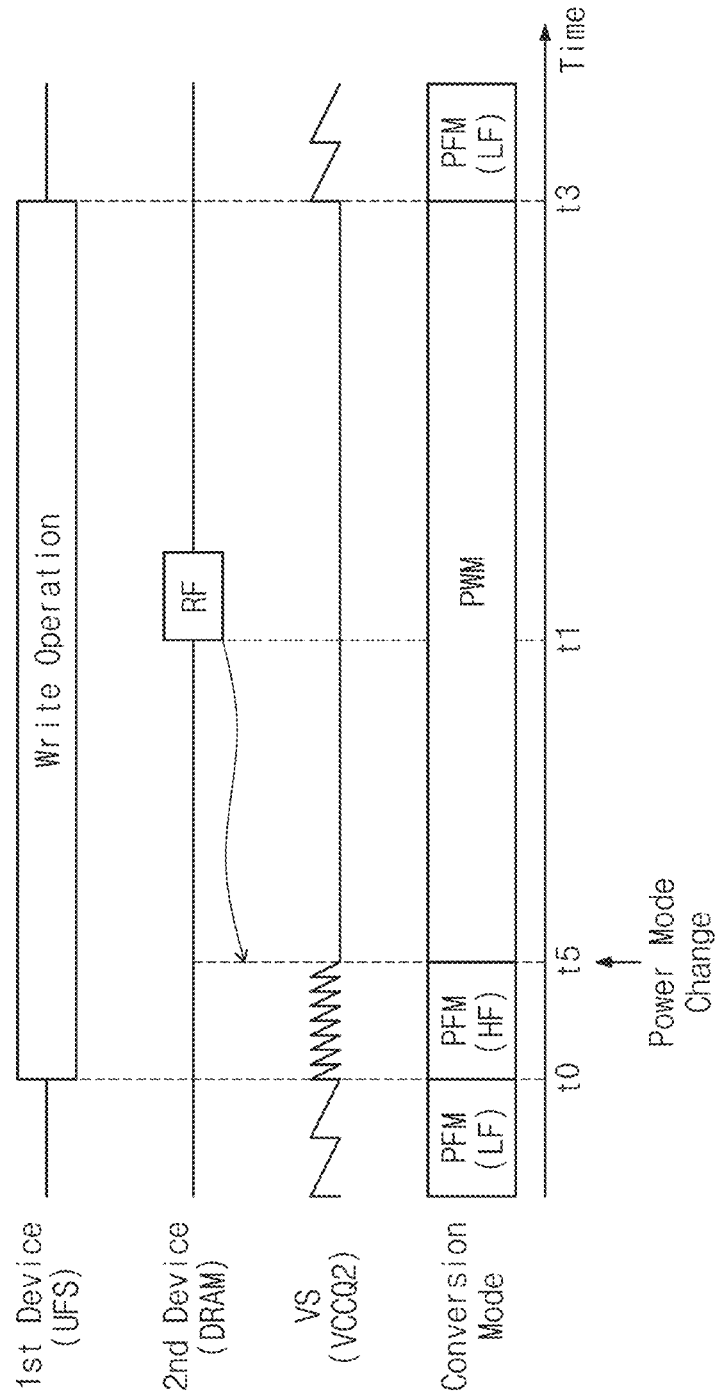

Alternatively, as illustrated in FIG. 6D, at point in time t0 at which the write operation of the first device 121 starts, the power mode manager 111 may change an operating frequency of the PMIC 130 from the low frequency LF to the high frequency HF. Afterwards, at point in time t5, the power mode manager 111 may change the power mode of the PMIC 130 from the PFM mode to the PWM mode. In example embodiments, the point in time t5 may be a point in time that is early as much as a given time or a reference time from point in time t1 at which the refresh operation RF of the second device 122 starts. In example embodiments, the given time or the reference time may be a time necessary to change the power mode of the PMIC 130. At point in time t3 at which the write operation of the first device 121 is completed, the power mode manager 111 may change the power mode of the PMIC 130 from the PWM mode to the PFM mode.

Figure 6E:
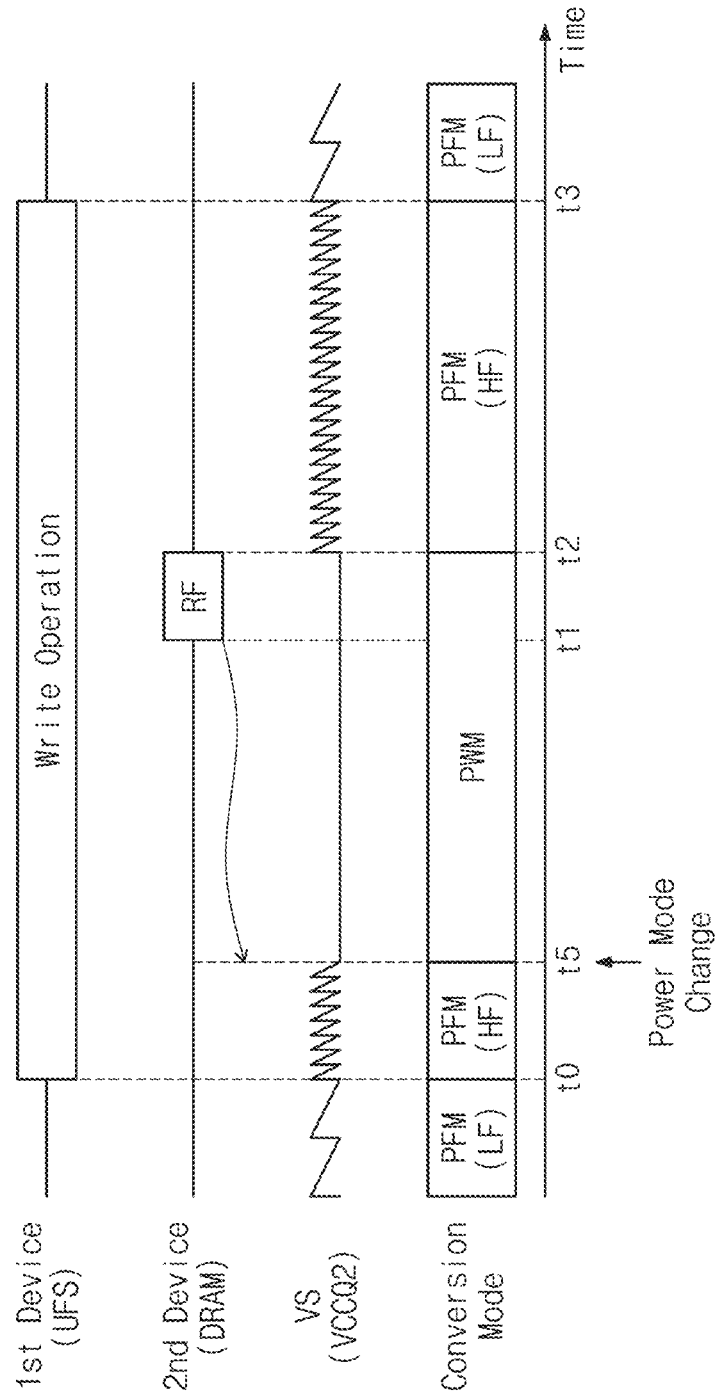

Alternatively, as illustrated in FIG. 6E, the power mode manager 111 may change the power mode of the PMIC 130 from the PFM mode to the PWM mode at point in time t5 and may change the power mode of the PMIC 130 from the PWM mode to the PFM mode at point in time t2.

Figure 6F:
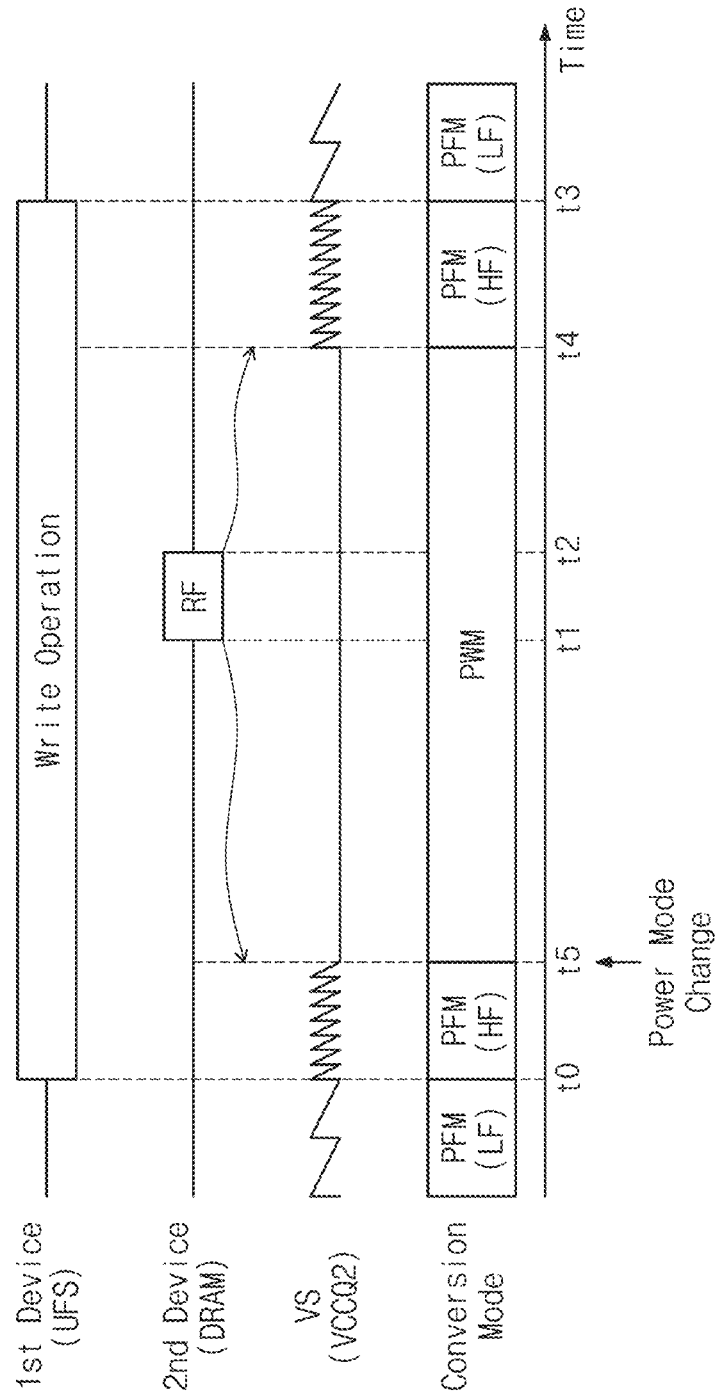

Alternatively, as illustrated in FIG. 6F, the power mode manager 111 may change the power mode of the PMIC 130 from the PFM mode to the PWM mode at point in time t5 and may change the power mode of the PMIC 130 from the PWM mode to the PFM mode at point in time t4.

In the timing diagrams of FIGS. 6E and 6F, the operation of changing the power mode of the PMIC 130 from the PFM mode to the PWM mode is similar to that described with reference to FIG. 6D, and the operation of changing the power mode of the PMIC 130 from the PWM mode to the PFM mode is similar to that described with reference to FIGS. 6B and 6C. Thus, additional description will be omitted to avoid redundancy.

As described above, the host device 110 according to the present disclosure may expect or predict a period in which operations of the first and second devices 121 and 122 are performed at the same time, based on the operation profile 112. The host device 110 may change the power mode of the PMIC 130 before the period is expected as the first and second devices 121 and 122 operate at the same time. Accordingly, the shared voltage VS that the first and second devices 121 and 122 share may be stably provided.

FIG. 7 is a diagram illustrating example embodiments of an operation profile included in a host device of FIG. 1. As described above, the power mode manager 111 of the host device 110 may determine a period in which the first and second devices 121 and 122 operate at the same time, based on the operation profile 112.

For example, the operation profile 112 may include information about expected execution times $T\_exe11$ to $T\_exe1n$ and expected start times $T\_st11$ to $T\_st1n$ of operations OP11 to OP1$n$ that are performed on the first device 121. The operation profile 112 may include information about expected execution times $T\_exe21$ to $T\_exe2m$ and expected start times $T\_st21$ to $T\_st2m$ of operations OP21 to OP2$m$ that are performed on the second device 122.

The power mode manager 111 of the host device 110 may determine a period in which the first and second devices 121 and 122 operate at the same time, through the operation profile 112 described above. For example, when a write operation of the first device 121 is performed, the power mode manager 111 may determine an expected execution time of the write operation of the first device 121. The power mode manager 111 may determine an operation to be performed in the second device 122 during the write operation of the first device 121 by checking the expected start times $T\_st21$ to $T\_st2m$ of the operations OP21 to OP2$m$ of the second device 122, based on the operation profile 112.

Figure 8:
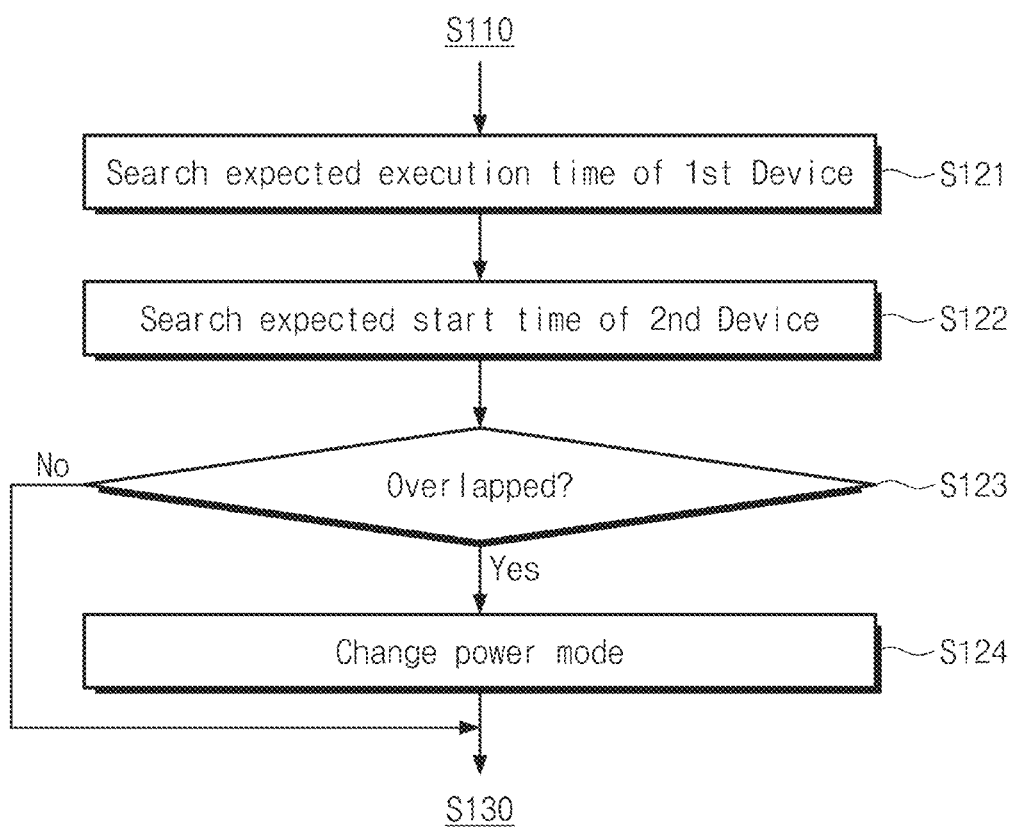
FIG. 8 is a flowchart illustrating operation S120 of FIG. 4 in detail.

FIG. 8 is a flowchart illustrating operation S120 of FIG. 4 in detail. Referring to FIGS. 1, 7, and 8, operation S120 of FIG. 4 may include operation S121 to operation S124.

In operation S121, the host device 110 may search an expected execution time of the first device 121. For example, the host device 110 may perform a write operation of the first device 121. The host device 110 may search an expected execution time of the write operation of the first device 121, based on the operation profile 112.

In operation S122, the host device 110 may search an expected start time of the second device 122, based on the operation profile 112. For example, the host device 110 may search expected start times of operations of the second device 122, based on the operation profile 112.

In operation S123, the host device 110 may determine whether the expected execution time of the operation of the first device 121 overlaps at least one of the expected start times of the operations of the second device 122. For example, that the expected execution time of the operation of the first device 121 overlaps at least one of the expected start times of the operations of the second device 122 may mean that the first and second devices 121 and 122 perform operations at the same time.

In some example embodiments (e.g., in example embodiments where the expected execution time of the operation of the first device 121 overlaps at least one of the expected start times of the operations of the second device 122), the host device 110 may change the power mode of the PMIC 130 in operation 124. For example, as described with reference to FIGS. 6A to 6F, the host device 110 may change the power mode of the PMIC 130 to the power mode (e.g., the PWM mode) corresponding to the heavy load before the operation of the second device 122 is performed (e.g., in advance).

That the expected execution time of the operation of the first device 121 does not overlap at least one of the expected start times of the operations of the second device 122 may mean that the first and second devices 121 and 122 do not perform operations at the same time.

In some example embodiments (e.g., in example embodiments where the expected execution time of the operation of the first device 121 does not overlap at least one of the expected start times of the operations of the second device 122), the host device 110 may not change the power mode of the PMIC 130. In example embodiments, to satisfy a voltage or current necessary for the operation of the first device 121, the PMIC 130 may change an operating frequency of the PFM mode.

An example of the operation profile 112 described above is only for describing example embodiments of the present disclosure briefly, and the present disclosure is not limited thereto. For example, the operation profile 112 may include various kinds of information for determining a simultaneous operation period of the first and second devices 121 and 122 in advance.

As described above, the host device 110 may change the power mode of the PMIC 130 configured to determine the simultaneous operation period of the first and second devices 121 and 122 using the shared voltage VS based on the operation profile 112 and to generate the shared voltage VS before the first and second devices 121 and 122 perform operations at the same time (e.g., in advance). Accordingly, the shared voltage VS may be stably provided to the first and second devices 121 and 122, and the stability and reliability of operation of the user system 100 may be improved.

Figure 9:
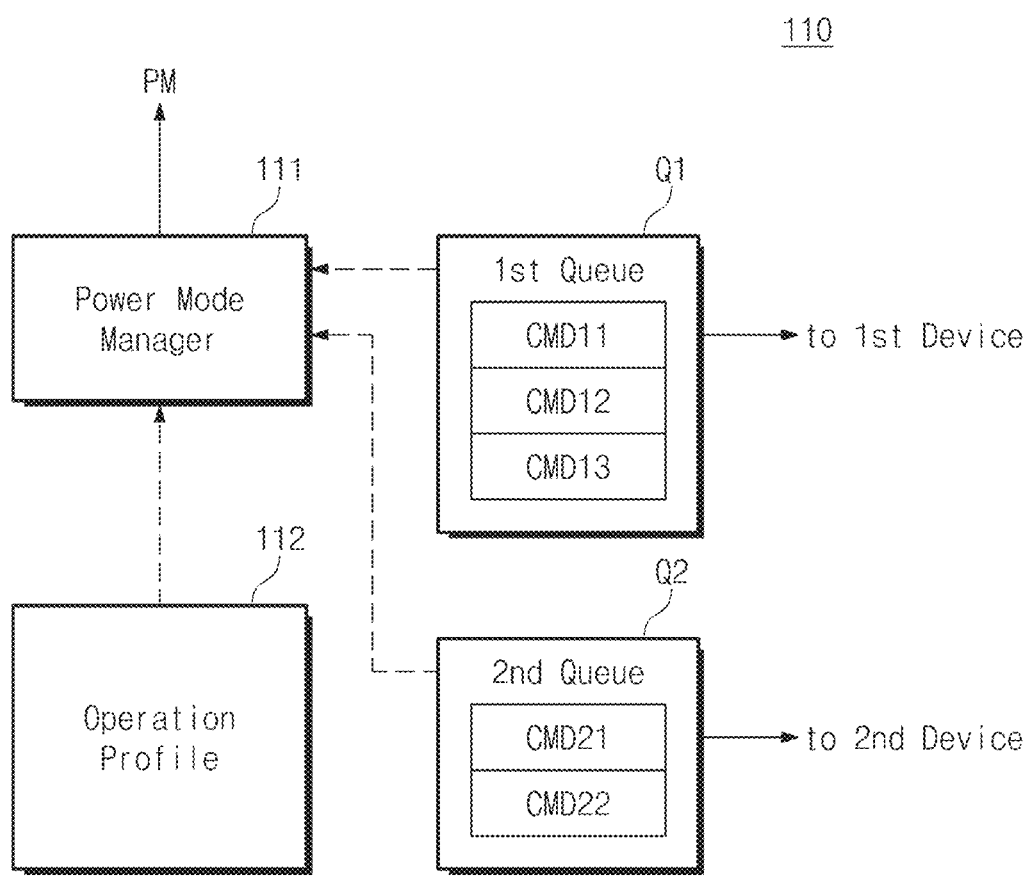
FIG. 9 is a diagram illustrating a host device of FIG. 1.

FIG. 9 is a diagram illustrating a host device of FIG. 1. Referring to FIGS. 1 and 9, the host device 110 may control the first device 121 by using a first command queue Q1 and may control the second device 122 by using a second command queue Q2. For example, the host device 110 may add and manage commands CMD11 to CMD13 for controlling the first device 121 to the first command queue Q1. The host device 110 may add and manage commands CMD21 and CMD22 for controlling the second device 122 to the second command queue Q2.

The power mode manager 111 may generate the power mode signal PM for controlling the power mode of the PMIC 130, based on a type or the number of commands included in the first and second command queues Q1 and Q2. For example, that commands are added to both of the first and second command queues Q1 and Q2 may mean that operations of the first and second devices 121 and 122 are performed in parallel or at the same time. In some example embodiments, the power mode manager 111 may change the power mode of the PMIC 130 to the power mode (e.g., the PWM mode) corresponding to the heavy load.

Alternatively, the power mode manager 111 may change the power mode of the PMIC 130, based on whether a given command is present in commands included in the first and second command queues Q1 and Q2. In example embodiments, the given command may include a command corresponding to an operation that the first and second devices 121 and 122 perform by using the shared voltage VS.

Alternatively, the power mode manager 111 may determine operations to be performed in the first and second devices 121 and 122 based on the commands included in the first and second command queues Q1 and Q2, may check information (e.g., an expected execution time and an expected start time) about the operations to be performed in the first and second devices 121 and 122 through the operation profile 112, and may change the power mode of the PMIC 130 based on the checked information.

As described above, the host device 110 may determine a period, in which the first and second devices 121 and 122 perform operations at the same time, based on various schemes and may change the power mode of the PMIC 130 in advance based on a result of the determination.

Figure 10:
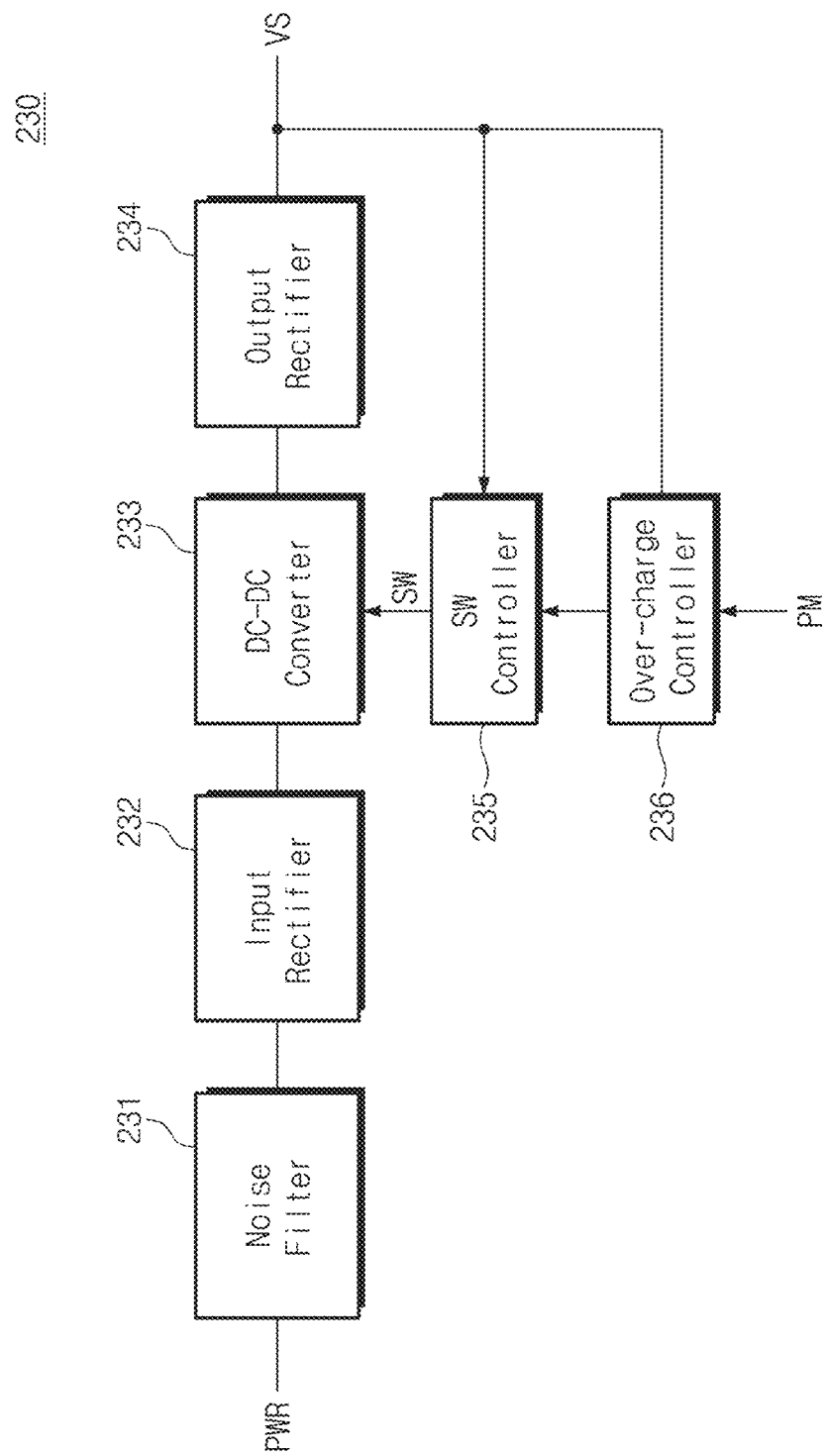
FIG. 10 is a block diagram illustrating a PMIC according to example embodiments of the present disclosure.

FIG. 10 is a block diagram illustrating a PMIC according to example embodiments of the present disclosure. In the example embodiments described with reference to FIGS. 1 to 9, the description is given as the PMIC 130 operates based the PFM mode and the PWM mode, but the present disclosure is not limited thereto. Referring to FIGS. 1 to 10, a PMIC 230 may include a noise filter 231, an input rectifier 232, a DC-DC converter 233, an output rectifier 234, and/or a switch controller 235. The noise filter 231, the input rectifier 232, the DC-DC converter 233, the output rectifier 234, and the switch controller 235 are similar to those described above, and thus, additional description will be omitted to avoid redundancy.

The PMIC 230 of FIG. 10 may further include an over-charge controller 236. The over-charge controller 236 may operate in response to the power mode signal PM from the host device 110 (refer to FIG. 1). For example, in response to the power mode signal PM from the host device 110 (refer to FIG. 1), the over-charge controller 236 may control the switch controller 235 such that a level of the shared voltage VS is greater than or equal to a second lower limit value greater than a first lower limit value.

For example, the PMIC 230 may operate in the PFM mode. In some example embodiments, when the level of the shared voltage VS reaches the first lower limit value, the switch controller 235 may increase the level of the shared voltage VS by increasing a frequency of the switching signal SW (or by increasing the number of times of an on-level of the switching signal SW). The switch controller 235 may maintain the shared voltage VS at the first lower limit value or more, through the above-described operation.

In response to the power mode signal PM, the over-charge controller 236 may change the first lower limit value of the switch controller 235 to the second lower limit value greater than the first lower limit value. In some example embodiments, when the level of the shared voltage VS reaches the second lower limit value, the switch controller 235 may increase the level of the shared voltage VS by increasing the frequency of the switching signal SW (or by increasing the number of times of an on-level of the switching signal SW). That is, the switch controller 235 may maintain the shared voltage VS at the second lower limit value or more, through the above-described operation.

As described above, as the lower limit value of the shared voltage VS is adjusted by the over-charge controller 236, the shared voltage VS may be stably provided in a heavy load state (e.g., in a state where the first and second devices 121 and 122 (refer to FIG. 1) operate at the same time).

Figure 11:
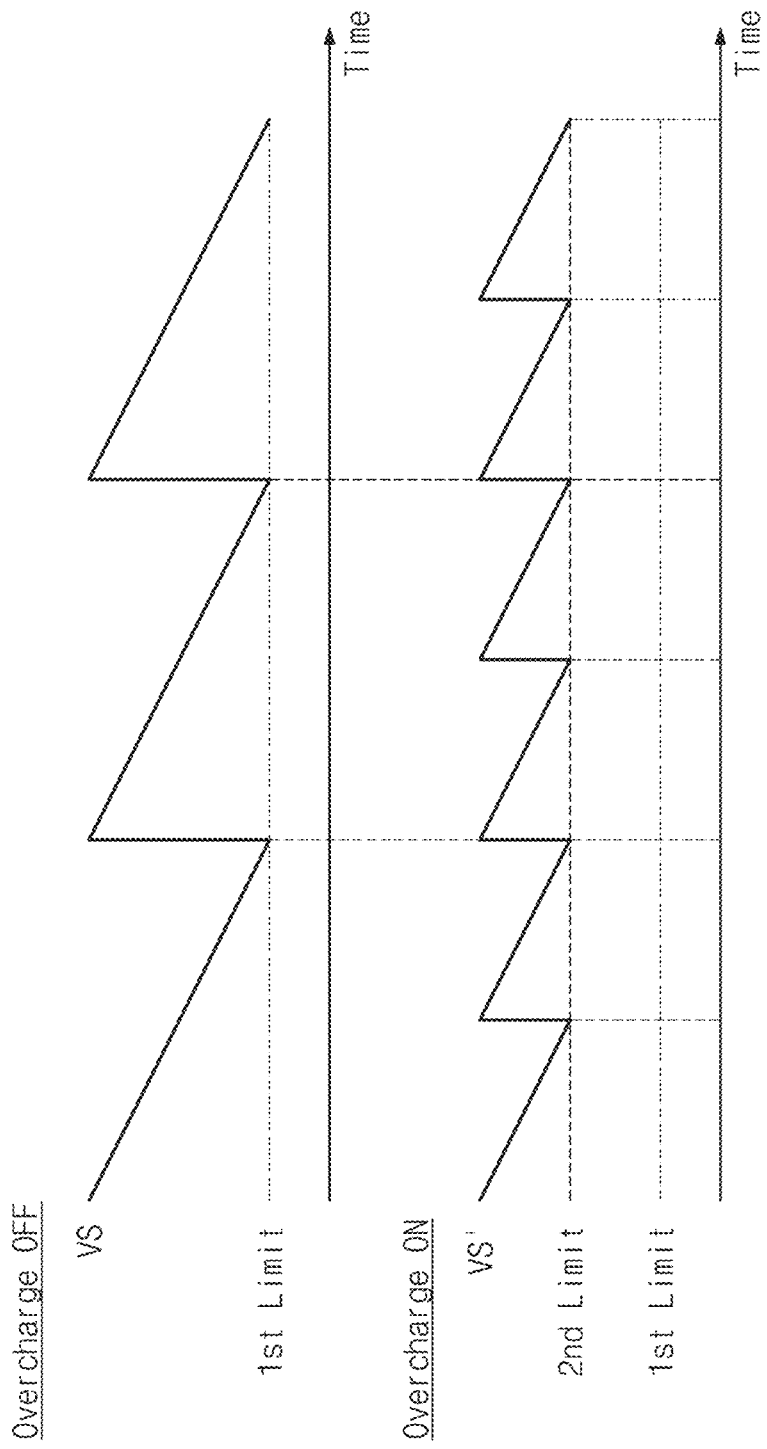
FIG. 11 illustrates a timing diagram illustrating a change in a shared voltage according to a power mode of a PMIC of FIG. 10.

FIG. 11 illustrates a timing diagram illustrating a change in a shared voltage according to a power mode of a PMIC of FIG. 10. Referring to FIGS. 10 and 11, a shared voltage VS or VS' generated by the PMIC 230 may decrease over time (or as first and second devices operate).

When the over-charge controller 236 does not operate (e.g., in an overcharge OFF state), the shared voltage VS generated from the PMIC 230 is charged to a specific level after reaching the first lower limit value "1st Limit". That is, when the over-charge controller 236 does not operate (e.g., in the overcharge OFF state), the shared voltage VS may decrease to the first lower limit value "1st Limit".

In contrast, when the over-charge controller 236 operates (e.g., in an overcharge ON state), the shared voltage VS generated from the PMIC 230 is charged to a specific level after reaching the second lower limit value "2nd Limit". In example embodiments, the second lower limit value "2nd Limit" may be greater than the first lower limit value "1st Limit". That is, the over-charge controller 236 may change a reference value for the shared voltage VS' from the first lower limit value "1st Limit" to the second lower limit value "2nd Limit", and the switch controller 235 may generate the switching signal SW based on the second lower limit value "2nd Limit" thus changed. In some example embodiments, the shared voltage VS' may maintain a level higher than the second lower limit value "2nd Limit".

As described above, as the reference value for the shared voltage VS' is changed by the operation of the over-charge controller 236, the minimum level of the shared voltage VS' may become relatively high, and thus, a stable voltage and current supply is possible in a heavy load state (e.g., in a state where the first and second devices 121 and 122 (refer to FIG. 1) operate at the same time).

Figure 12:
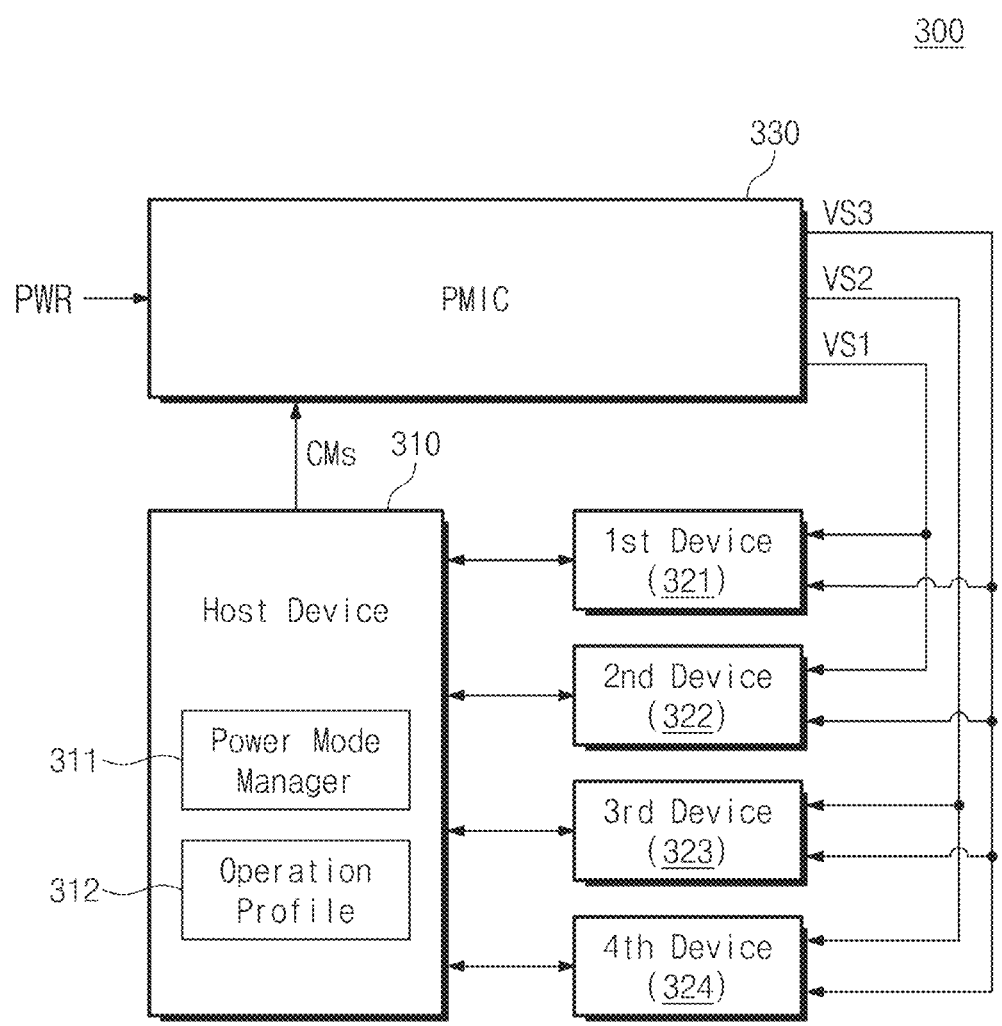
FIG. 12 is a block diagram illustrating a user system according to example embodiments of the present disclosure.

FIG. 12 is a block diagram illustrating a user system according to example embodiments of the present disclosure. Referring to FIG. 12, a user system 300 may include a host device 310, a plurality of devices 321 to 324, and/or a PMIC 330.

The plurality of devices 321 to 324 may operate under control of the host device 310. The plurality of devices 321 to 324 may be provided with various voltages from the PMIC 330 and may operate by using the provided voltages.

In example embodiments, some of the plurality of devices 321 to 324 may share some of various operating voltages from the PMIC 330. For example, the first and second devices 321 and 322 may share a first shared voltage VS1 from the PMIC 330. The third and fourth devices 323 and 324 may share a second shared voltage VS2 from the PMIC 330. The first to fourth devices 321 to 324 may share a third shared voltage VS3 from the PMIC 330.

The host device 310 may include a power mode manager 311 and an operation profile 312. The power mode manager 311 may determine a period, in which devices sharing the same shared voltage perform operations at the same time, based on the operation profile 312 and may change a power mode of the PMIC 330 generating the same shared voltage in advance based on a determination result. For example, based on the operation profile 312, the power mode manager 311 may determine whether operations of the remaining devices 322, 323, and 324 are to be performed, while performing the operation of the first device 321. When the operation of the second device 322 is predicted as being to be performed while the operation of the first device 321 is performed (e.g., when the first and second devices 321 and 322 are predicted as operating at the same time), the power mode manager 311 may change the power mode such that the PMIC 330 generates the first and third shared voltages VS1 and VS3 (e.g., shared voltages to be shared by the first and second devices 321 and 322) based on the power mode corresponding to the heavy load. In some example embodiments, the power mode manager 311 may change the power mode of the PMIC 330 before the first and second devices 321 and 322 operate at the same time (e.g., in advance).

As described above, the power mode manager 311 of the host device 310 may determine a period (e.g., an overlapping period), in which at least some of the plurality of devices 321 to 324 operate at the same time, based on the operation profile 312 and may control the power mode of the PMIC 330 based on a determination result.

In the above example embodiments, the description is given as the power mode manager 311 and the operation profile 312 are included in the host device 310 or are managed by the host device 310, but the present disclosure is not limited thereto. For example, the power mode manager 311 and the operation profile 312 may be implemented with a separate device independent of the host device 310, and may determine the above overlapping period by monitoring an operation of the host device 310 or operations of the plurality of devices 321 to 324. Alternatively, the power mode manager 311 and the operation profile 312 may be included in the PMIC 330.

In example embodiments, the operation profile 312 may be in advance determined based on operation characteristics of the plurality of devices 321 to 324. Alternatively, the operation profile 312 may be updated in real time based on the operation characteristics or wear levels of the plurality of devices 321 to 324.

Figure 13:
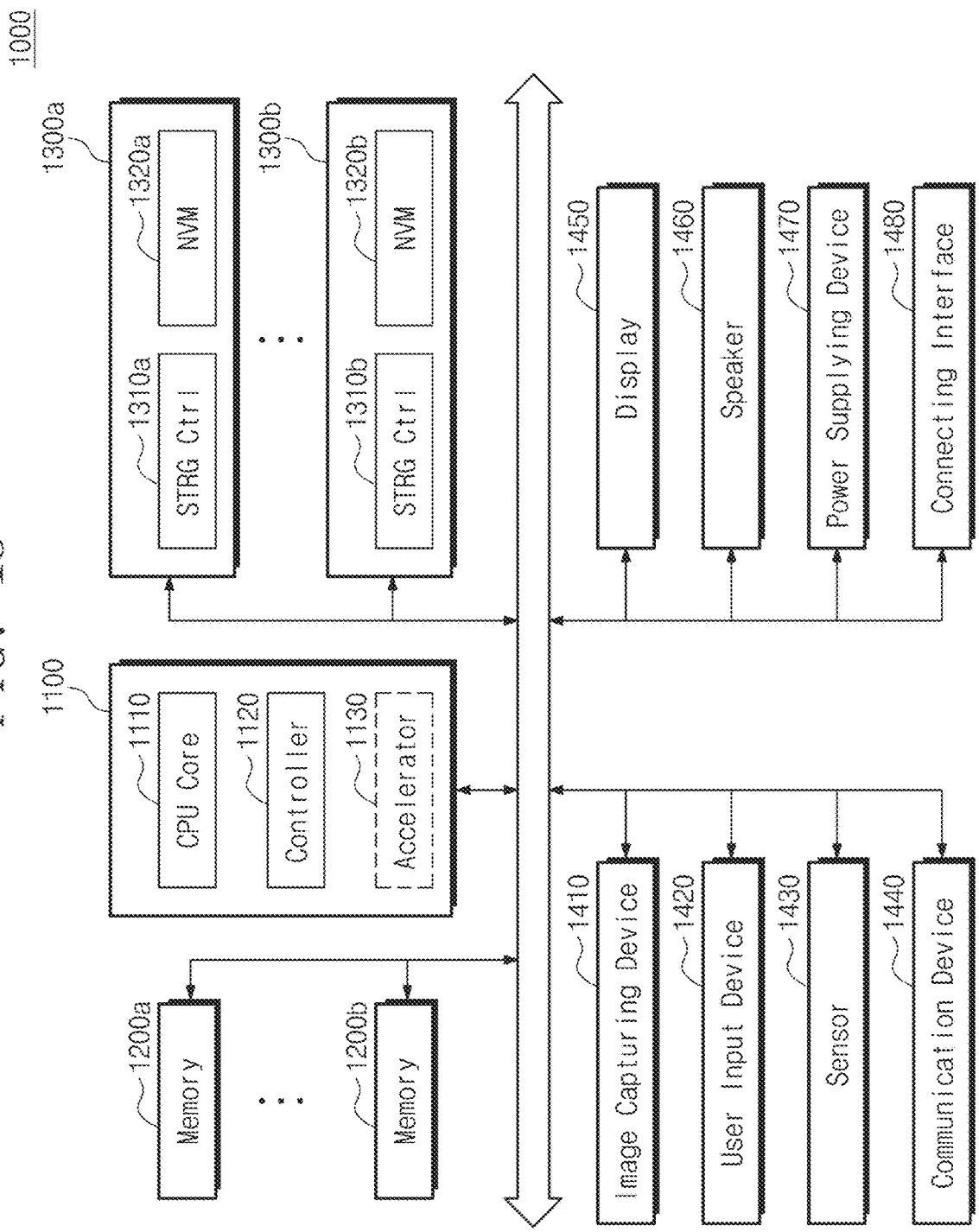
FIG. 13 is a diagram illustrating a user system according to example embodiments of the present disclosure.

FIG. 13 is a diagram of a system 1000 to which a storage device is applied, according to example embodiments. The system 1000 of FIG. 13 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 13 is not necessarily limited to the mobile system and may be a PC, a laptop computer, a server, a media player, or an automotive device (e.g., a navigation device).

Referring to FIG. 13, the system 1000 may include a main processor 1100, memories (e.g., 1200a and 1200b), and/or storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and/or a connecting interface 1480.

The main processor 1100 may control all operations of the system 1000, for example, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some example embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVM (Non-Volatile Memory)s 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

In example embodiments, at least some of various components included in the system 1000 may share a specific power or a specific voltage provided from the power supplying device 1470. In some example embodiments, the main processor 1100 of the system 1000 may determine an overlapping period, in which operations of components sharing the specific power or the specific voltage overlap each other, based on the methods described with reference to FIGS. 1 to 12 and may change a power mode of the power supply device 1470 before the overlapping period depending on a determination result.

In example embodiments, the operation profile and the power mode manager used to determine an overlapping period in which at least some of various components operates at the same time may be stored in the memories 1200a and 1200b, and may be driven by the main processor 1100. Alternatively, the operation profile and the power mode manager may be embedded in the power supplying device 1470.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 14:
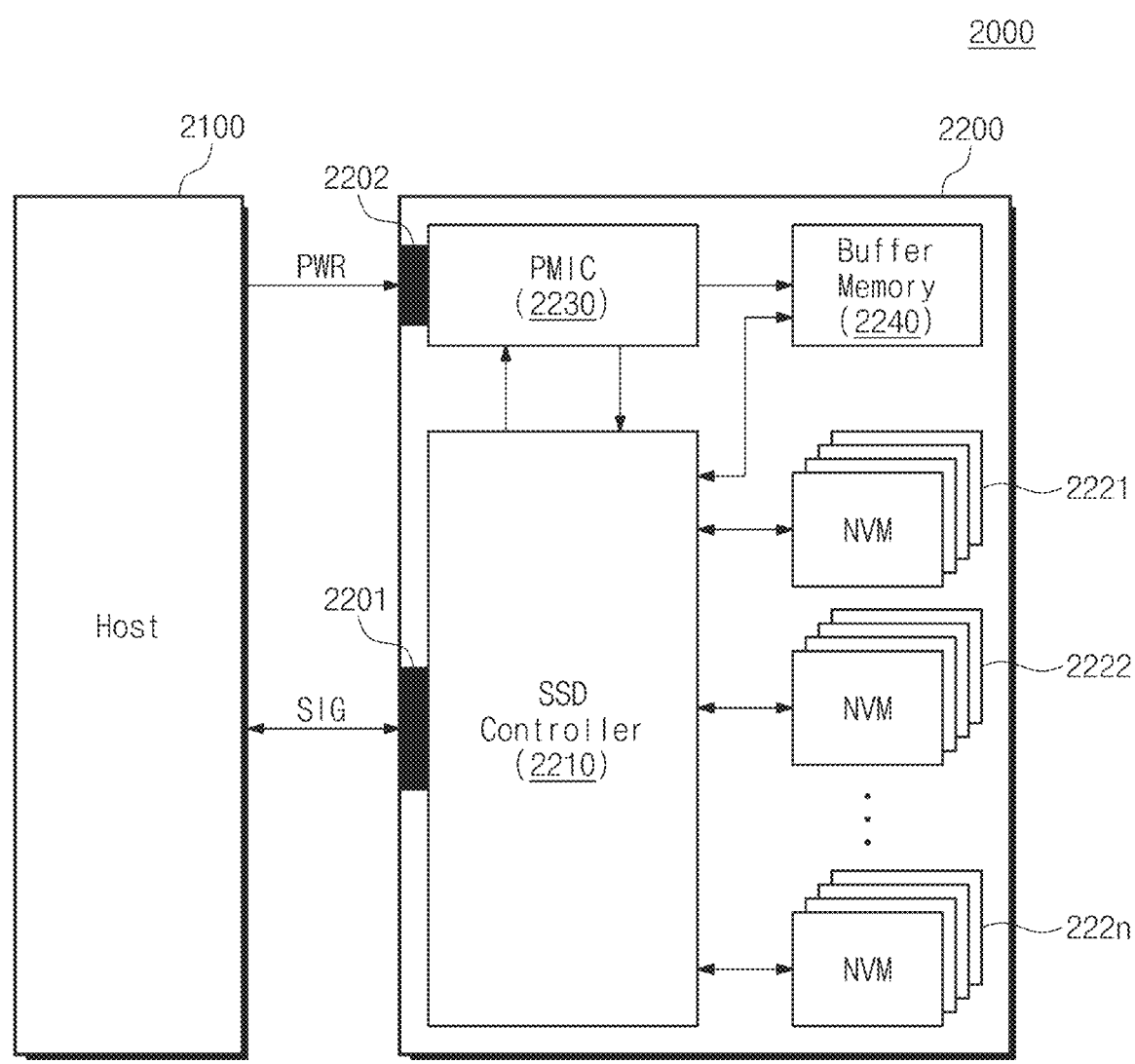
FIG. 14 is a block diagram illustrating a solid state drive (SSD) system according to the present disclosure.

FIG. 14 is a block diagram illustrating a solid state drive (SSD) system according to the present disclosure. Referring to FIG. 14, an SSD system 2000 may include a host 2100 and/or a storage device 2200. The storage device 2200 may exchange signals SIG with the host 2100 through a signal connector 2201 and may be supplied with a power PWR through a power connector 2202. The storage device 2200 may include an SSD controller 2210, a plurality of nonvolatile memories 2221 to 222n, a PMIC 2230, and a buffer memory 2240.

The SSD controller 2210 may control the plurality of nonvolatile memories 2221 to 222n in response to the signals SIG received from the host 2100. The plurality of nonvolatile memories 2221 to 222n may operate under control of the SSD controller 2210. The buffer memory 2240 may be used as a buffer memory of the storage device 2200.

The PMIC 2230 is connected with the host 2100 through the power connector 2202. The PMIC 2230 may receive the power PWR from the host 2100 and may power the storage device 2200. In example embodiments, the PMIC 2230 may be configured to change a power mode under control of the SSD controller 2210. For example, the SSD controller 2210 may be configured to determine an overlapping period in which at least some of various components included in the SSD system 2000 operates at the same time and to change the power mode of the PMIC 2230 before the overlapping period. A configuration for changing the power mode is similar to that described with reference to FIGS. 1 to 12, and thus, additional description will be omitted to avoid redundancy.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to the present disclosure, a host device may expect (or predict) an overlapping period in which at least two devices sharing the same shared voltage operate at the same time and may change a power mode of a power management integrated circuit, which generates the shared voltage, before the overlapping period. Accordingly, because a shared voltage or current is stably provided to each device, a user system including first and second devices sharing the shared voltage with improved power reliability and a power management integrated circuit configured to generate the shared voltage, and an operation method thereof are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An operation method of a user system which includes a first device and a second device, which share a shared voltage, and a power management integrated circuit (PMIC) configured to generate the shared voltage, the method comprising:
performing a first operation of the first device;
predicting whether a second operation of the second device is to be performed while the first device performs the first operation, based on an operation profile; and
when it is predicted that the second operation of the second device is to be performed while the first device performs the first operation, changing a power mode of the PMIC from a first power mode to a second power mode, before the second device performs the second operation,
wherein the PMIC is configured to generate the shared voltage based on the first power mode or the second power mode.

2. The method of claim 1, wherein the first device is a universal flash storage (UFS) device, and the second device is a dynamic random access memory (DRAM) device, and
wherein the shared voltage is a VDDQ2 voltage of 1.8 V.

3. The method of claim 2, wherein the second operation includes a refresh operation of the DRAM device.

4. The method of claim 1, wherein the first power mode is a pulse frequency modulation (PFM) mode, and the second power mode is a pulse width modulation (PWM) mode.

5. The method of claim 1, wherein the power mode of the PMIC is changed from the first power mode to the second power mode at a same time when the first device starts to perform the first operation.

6. The method of claim 1, wherein the power mode of the PMIC is changed from the first power mode to the second power mode, before a given time from a point in time when the second device starts to perform the second operation.

7. The method of claim 1, further comprising:
performing the second operation of the second device after the power mode of the PMIC is changed from the first power mode to the second power mode.

8. The method of claim 7, further comprising:
changing the power mode of the PMIC from the second power mode to the first power mode, after a given time passes from a point in time when the second operation of the second device is completed.

9. The method of claim 7, further comprising:
changing the power mode of the PMIC from the second power mode to the first power mode, at a point in time when the second operation of the second device is completed and the first operation of the first device is then completed.

10. The method of claim 1, wherein the operation profile includes information about an expected execution time and an expected start time associated with each of operations of the first and second devices.

11. A user system comprising:
a power management integrated circuit (PMIC) configured to generate a shared voltage, based on one of a first power mode and a second power mode;
a first device configured to operate by using the shared voltage;
a second device configured to operate by using the shared voltage; and
a host device configured to control the first device and the second device, to predict an overlapping period in which the first device and the second device perform operations at a same time, and to change a power mode of the PMIC from the first power mode to the second power mode before the overlapping period.

12. The user system of claim 11, wherein the host device includes an application processor,
wherein the first device is a first universal flash storage (UFS) device,
wherein the second device is a dynamic random access memory (DRAM) device, and
wherein the shared voltage is a VDDQ2 voltage of 1.8 V.

13. The user system of claim 11, wherein the PMIC includes:
a noise filter configured to remove a noise of an input power;
an input rectifier configured to rectify an output of the noise filter;
a DC-DC converter configured to convert an output of the input rectifier, in response to a switching signal;
an output rectifier configured to rectify an output of the DC-DC converter to output the shared voltage; and
a switch controller configured to generate the switching signal based on the shared voltage, depending on the first power mode or the second power mode.

14. The user system of claim 13, wherein the first power mode is a pulse frequency modulation (PFM) mode, and the second power mode is a pulse width modulation (PWM) mode.

15. The user system of claim 13, wherein the PMIC further includes:
an over-charge controller configured to control a lower limit value of the shared voltage under control of the host device, and
wherein the switch controller generates the switching signal such that the shared voltage is greater than or equal to the lower limit value controlled by the over-charge controller.

16. The user system of claim 11, wherein the host device includes an operation profile including information about an expected execution time and an expected start time associated with each of operations of the first and second devices, and
wherein the host device predicts the overlapping period based on the operation profile.

17. The user system of claim 11, wherein the host device controls the power mode of the PMIC through a system power management interface (SPMI).

18. An operation method of a user system which includes a universal flash storage (UFS) device and a dynamic random access memory (DRAM) device, which share a first voltage, and a power management integrated circuit (PMIC) configured to generate the first voltage, the method comprising:
performing a write operation on the UFS device; and
when a refresh operation of the DRAM device is predicted to be performed while the write operation is performed, changing a power mode of the PMIC from a first power mode to a second power mode, before the refresh operation is performed.

19. The method of claim 18, wherein the first power mode is a pulse frequency modulation (PFM) mode, and the second power mode is a pulse width modulation (PWM) mode.

20. The method of claim 18, wherein the power mode of the PMIC is changed from the first power mode to the second power mode, at a point in time when the write operation of the UFS device starts to be performed.

* * * * *